(12) United States Patent
Ayazi et al.

(10) Patent No.: US 7,847,656 B2
(45) Date of Patent: Dec. 7, 2010

(54) MONOLITHIC THIN-FILM PIEZOELECTRIC FILTERS

(75) Inventors: Farrokh Ayazi, Atlanta, GA (US); Reza Abdolvand, Stillwater, OK (US)

(73) Assignee: Georgia Tech Research Corporation, Atlanta, GA (US)

( * ) Notice: Subject to any disclaimer, the term of this patent is extended or adjusted under 35 U.S.C. 154(b) by 199 days.

(21) Appl. No.: 11/881,100

(22) Filed: Jul. 25, 2007

(65) Prior Publication Data
US 2008/0079515 A1 Apr. 3, 2008

Related U.S. Application Data

(60) Provisional application No. 60/833,753, filed on Jul. 27, 2006.

(51) Int. Cl.
*H03H 9/54* (2006.01)
(52) U.S. Cl. .................................................. 333/187
(58) Field of Classification Search ................. 333/189, 333/187
See application file for complete search history.

(56) References Cited

U.S. PATENT DOCUMENTS

| | | | |
|---|---|---|---|
| 3,517,350 A | 6/1970 | Beaver | |
| 3,564,463 A | 2/1971 | Beaver | |
| 4,329,666 A | 5/1982 | Arvanitis | |
| 6,791,430 B2* | 9/2004 | Borzenets et al. | 333/17.1 |
| 6,909,221 B2* | 6/2005 | Ayazi et al. | 310/321 |
| 6,940,370 B2* | 9/2005 | Bircumshaw et al. | 333/197 |
| 7,002,437 B2* | 2/2006 | Takeuchi et al. | 333/187 |
| 7,098,758 B2* | 8/2006 | Wang et al. | 333/189 |
| 7,312,674 B2* | 12/2007 | Duwel et al. | 333/186 |
| 7,466,213 B2* | 12/2008 | Lobl et al. | 333/187 |
| 7,492,241 B2* | 2/2009 | Piazza et al. | 333/189 |
| 2006/0033595 A1* | 2/2006 | Nagao et al. | 333/189 |

OTHER PUBLICATIONS

R. Ruby, et al., "Acoustic FBAR for filters, duplexers and front end modules," IEEE MTT-S International Microwave Symposium Digest, vol. 2, pp. 931-934, Jun. 2004.
Lakin, K.M., "Coupled resonator filters," Ultrasonics Symposium, 2002. Proceedings. 2002 IEEE , vol. 1, pp. 901-908, Oct. 8-11, 2002.

(Continued)

*Primary Examiner*—Benny Lee
*Assistant Examiner*—Alan Wong
(74) *Attorney, Agent, or Firm*—Thomas, Kayden, Horstemeyer & Risley, LLP

(57) ABSTRACT

Disclosed are exemplary monolithic acoustically coupled thin film piezoelectric-on-substrate filters that operate in a wide frequency range. The monolithic thin-film-piezoelectric acoustic filters includes a resonant structure that is released from and supported by a substrate that comprises a thin-film piezoelectric layer disposed between a lower electrode and a plurality of electrically isolated upper electrodes. Second order narrowband filters are realized by utilizing coupled resonance modes of a single microstructure. Narrow-bandwidth filters are disclosed that are suitable for channel-select applications in IF and RF bands. Filter Q values of 800 at 250 MHz, 470 at 360 MHz, and 400 at 3.5 GHz for small footprint second-order filters are disclosed. The measured power handling of these devices is high due to the use of high energy density structural material, showing a 0.2 dB compression point of >15 dBm at 360 MHz.

18 Claims, 7 Drawing Sheets

OTHER PUBLICATIONS

S. Humad, R. Abdolvand, G.K. Ho,, et al., "High Frequency Micromechanical Piezo-On-Silicon Block Resonators," Tech. Dig. IEEE Int. Electron Devices Meeting (IEDM 2003), Washington, DC, Dec. 2003, pp. 957-960.

"802.16.2: IEEE Recommended Practice for Local and Metropolitan Area Networks: Coexistence of Fixed Broadband Wireless Access Systems", IEEE Computer Society and the IEEE Microwave Theory and Techniques Society, IEEE, Mar. 17, 2004.

Lakin, K.M., et al., "Thin Film Resonators and Filters", 1982 Ultrasonics Symposium, pp. 466-475, Oct. 1982.

Beaver, W.D., "Theory and Design of the Monolithic Crystal Filter," 21st Annual Symposium on Frequency Control, pp. 179-199, Apr. 1967.

* cited by examiner

MONOLITHIC THIN-FILM PIEZOELECTRIC FILTERS

CROSS REFERENCE TO RELATED APPLICATIONS

This application claims priority to copending U.S. provisional application entitled "ACOUSTICALLY COUPLED THIN FILM PIEZO RESONATOR FILTERS ON A MONOLITHIC RESONATING STRUCTURE" having Ser. No. 60/833,753, filed Jul. 27, 2006.

STATEMENT REGARDING FEDERALLY SPONSORED RESEARCH OR DEVELOPMENT

This invention was made with government support under agreement ECS-0348286 awarded by the National Science Foundation. The Government has certain rights in the invention.

BACKGROUND

The present invention relates generally to filters, and more particularly, to monolithic acoustically coupled thin-film piezoelectric filters.

Narrowband channel-select filters can bring significant power saving to RF communication systems. Large filter Q in excess of a few hundreds and small shape-factors are required to prevent cross-talk between closely-spaced channels.

Thin-film piezoelectric bulk acoustic resonators (FBAR) are utilized in the front-end of some transceiver circuits at GHz frequencies. See, for example, R. Ruby, et al., "Acoustic FBAR for filters, duplexers and front end modules," *IEEE MTT-S International Microwave Symposium Digest*, Vol. 2, pp. 931-934, June 2004. Typically, a number of FBAR resonators are electrically connected in a ladder configuration to provide low-loss high-order filters with a very sharp roll-off skirt. To provide adequate out-of-band rejection, the number of resonators in the coupling chain of electrically-coupled filters should be considerably large (between 4 to 10). Given the relatively large size of each resonator, electrically coupled FBAR filters span over a large area, and may not offer integrated solutions for covering dispersed frequencies in a wide band. The size of the filter is of greater importance in emerging applications where multiple-band data transfer channels are required in a small form-factor.

Acoustic coupling of individual resonators can potentially offer much better out-of-band rejection in a small footprint. Electrical isolation between input and output ports of an acoustically-coupled filter is the key to reach large isolation in a low-order coupled system. Second-order stacked thin-film piezoelectric bulk acoustic wave (BAW) filters have been demonstrated with narrow pass-bands and excellent isolation suitable for applications where small size is critical. See, for example, Lakin, K. M., "Coupled resonator filters," *Proceesings of the IEEE* 2002 *Ultrasonics Symposium*, vol. 1, pp. 901-908, 8-11 Oct., 2002.

The principle of operation of the presently-disclosed acoustically-coupled filters is similar to that of conventional stacked piezoelectric filters. However, the fabrication process in stacked filters is relatively complicated as multiple precisely-controlled thin-film deposition steps are involved, and thickness deviation can substantially degrade the performance of the filter. These filters also suffer from single-band operation on a chip. Monolithic quartz crystal filters are another example of acoustic filters widely utilized in IF frequency band. Exemplary quartz crystal filters are disclosed in U.S. Pat. Nos. 3,517,350 and 3,564,463 issued to Beaver, for example.

It would be desirable to have improved multi-center-frequency monolithic thin-film piezoelectric filters fabricated on a single chip which can operate at high frequencies.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
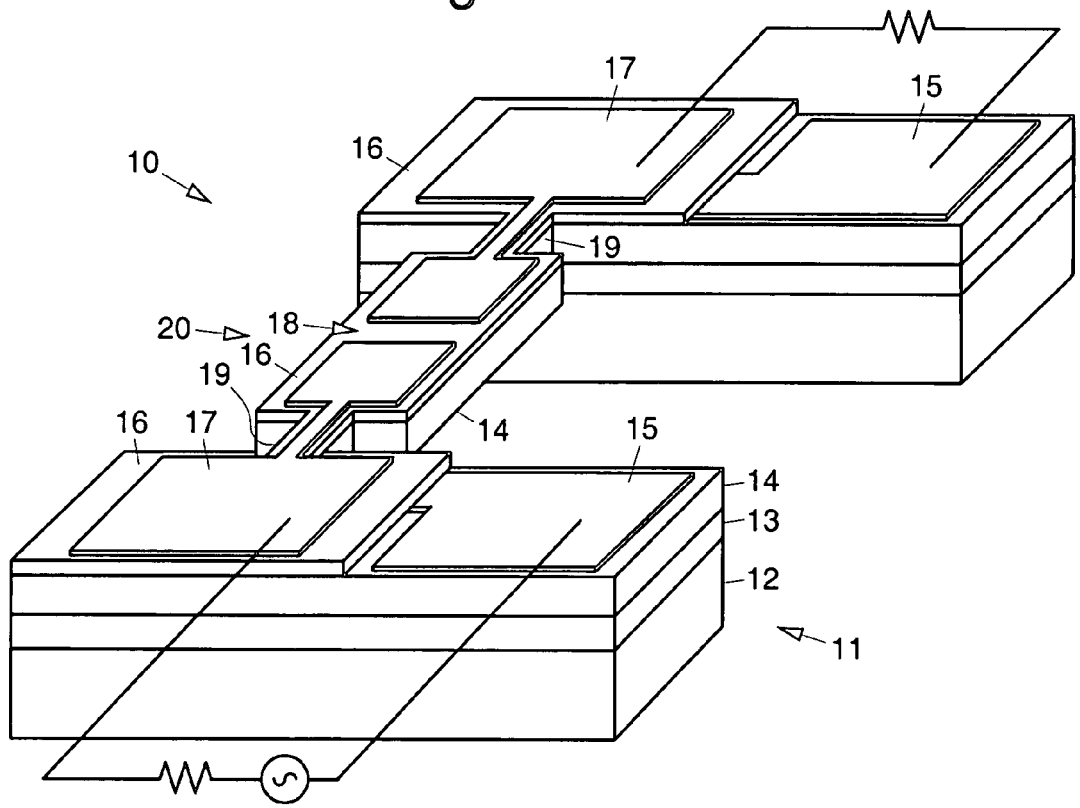
FIG. 1 illustrates an exemplary monolithic thin-film piezoelectric-on-substrate filter.

Disclosed are microelectromechanical acoustic filter apparatus comprising exemplary acoustically coupled thin-film piezoelectric resonator systems in which all resonators are implemented on a monolithic resonating structure. The coupled resonators may be used in signal processing to realize bandpass filters.

The resonant structure in its most general form includes a stack of multiple layers of material released from a substrate. A thin film piezoelectric material such as zinc oxide (ZnO), aluminum nitride (AlN), or lead zirconate titanate (PZT), and the like, is incorporated somewhere in the multi-layer stack. The desired resonance mode of operation for the resonator may be an extensional, flexural, or shear mode.

The piezoelectric layer is sandwiched between two metal electrodes in selected areas over the released resonant structure to excite a specific resonance mode shape. By placing two sets of individual electrodes on the resonant structure dual coupled modes of the structure can be excited and an acoustic filter is realized.

The frequency spacing between the separate resonance peaks (and consequently the bandwidth of the filter) is dependent on the coupling strength which is determined by the mass loading of the electrodes, the dimensions of the resonant structure and the dimensions/locations of the neighboring electrodes. The disclosed invention extends the technique used in monolithic crystal filters to the field of micromachined thin-film piezoelectric resonators. The thin-film piezoelectric resonators can be batch fabricated on a standard substrate such as silicon, silicon-on-insulator (SOI), or polycrystalline diamond deposited on silicon. The frequency determining dimension of the localized resonator is either lithographically defined (geometry of lateral bulk acoustic resonators) or process controlled (thickness of the resonant structure).

In acoustically-coupled-resonator filters, such as are described herein, input and output ports of the filter can potentially be electrically isolated. Therefore the out-of-band rejection of the filter is higher compared to filters realized by electrically connecting individual resonators in a specific configuration such as ladder filters. On the other hand, in the monolithic filters described herein, there is no need for any discrete coupling elements (e.g., spring-coupled resonator filters) or stacked layers of piezoelectric material (e.g., stacked bulk acoustic resonator filters). The bandwidth of the filter is also adjustable by changing the geometry and the location of the electrodes.

More particularly, disclosed is a new type of acoustically-coupled piezoelectric filter referred to as a monolithic thin-film piezoelectric filter. Dual resonance modes on a composite resonant microstructure are coupled to achieve a higher order system.

In one implementation, the resonant structure is a stack of piezoelectric material, such as zinc oxide (ZnO), sandwiched between two metal electrode layers on top of a released substrate layer such as silicon. A silicon substrate with high acoustic velocity and low acoustic loss is used to improve the linearity and the quality factor. High energy density of the silicon substrate can also enhance the linearity of the device. Improved structural integrity is another advantage of using silicon which can elevate yield and manufacturing issues involved with other technologies that employ thin free-standing membranes of piezoelectric films. Multiple-frequency filters on a single substrate are implemented by changing the lateral geometry of the filters. A slight frequency shift in thickness mode devices covering multiple adjacent channels in a single-band and a substantial change in the resonance frequency for lateral mode devices is obtained for multiple-band operation of the filters by altering the lateral dimension of the resonant plate and the upper electrodes.

Referring to the drawing figures, FIG. 1 illustrates an exemplary monolithic thin-film piezoelectric-on-substrate filter 10. The exemplary monolithic thin-film piezoelectric-on-substrate filter 10 comprises a substrate 11, such as a silicon-on-insulator substrate 11. The silicon-on-insulator substrate 11 comprises a lower thick layer 12 (handle layer 12) and an upper layer 14 (device layer 14) separated by an insulating layer 13. Alternatively, the lower and upper layers 12, 14 may be made of other suitable material such as diamond and sapphire, and in that case the insulating layer is not necessarily required.

A lower conductive layer 15 that forms a lower electrode 15 is disposed on top of the upper substrate 14 of the silicon-on-insulator substrate 11. A piezoelectric layer 16 is disposed on top of the lower conductive layer 15 (ground electrode 15). An upper conductive layer 17 that forms a plurality of electrically isolated upper electrodes 17 is disposed on top of the piezoelectric layer 16. The top electrodes 17 are electrically isolated by separating them through a gap 18. The lower electrode 15 can either comprise of two isolated metal pieces or form a unified common electrode. One upper electrode 17 functions as an input electrode, while the other upper electrode 17 functions as an output electrode.

The input to the filter 10 is connected between one of the upper electrodes and the ground electrode 15. The output of the filter 10 is connected between the other of the upper electrodes and the ground electrode 15.

A resonant structure 20 is released from and supported by the substrate 11. In particular, the lower substrate 12 and the insulating layer 13 are removed from beneath the upper substrate 14 and the plurality of electrically isolated upper electrodes 17, and from beneath support bridges 19 (or support beams 19) that connect the resonant structure 20 to the adjacent portion of the upper substrate 14.

The input electrode 17, the output electrode 17, and the common electrode 15 are designed carefully to maximize the electromechanical coupling to the dual resonance modes of the structure. The two modes are coupled and a coupled acoustic system that produces a bandpass frequency response is realized.

Figure 2:
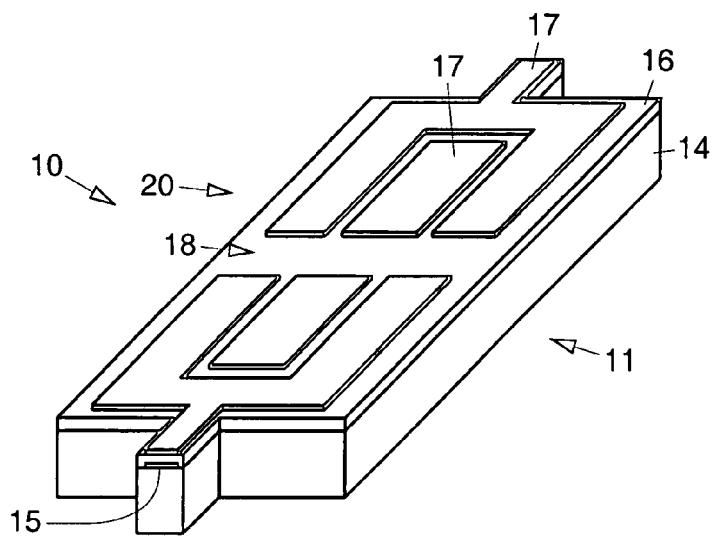
FIG. 2 illustrates a second exemplary monolithic thin-film piezoelectric-on-substrate filter.

FIG. 2 illustrates a second exemplary monolithic thin-film piezoelectric-on-substrate filter 10. Only the resonant structure 20 of the filter 10 is shown in FIG. 2. The resonant structure 20 of the exemplary filter 10 comprises a substrate 14 on which a piezoelectric layer 16 is disposed. A plurality of upper electrodes 17 is disposed on top of the piezoelectric layer 16. The upper electrodes 17 are configured having equally spaced fingers that are connected alternatively. These fingers are designed to match the periodic pattern of strain field in a third-order lateral extension mode of the resonant plate structure. A gap 18 separates the adjacent ends of the respective electrodes 17.

Figure 3:
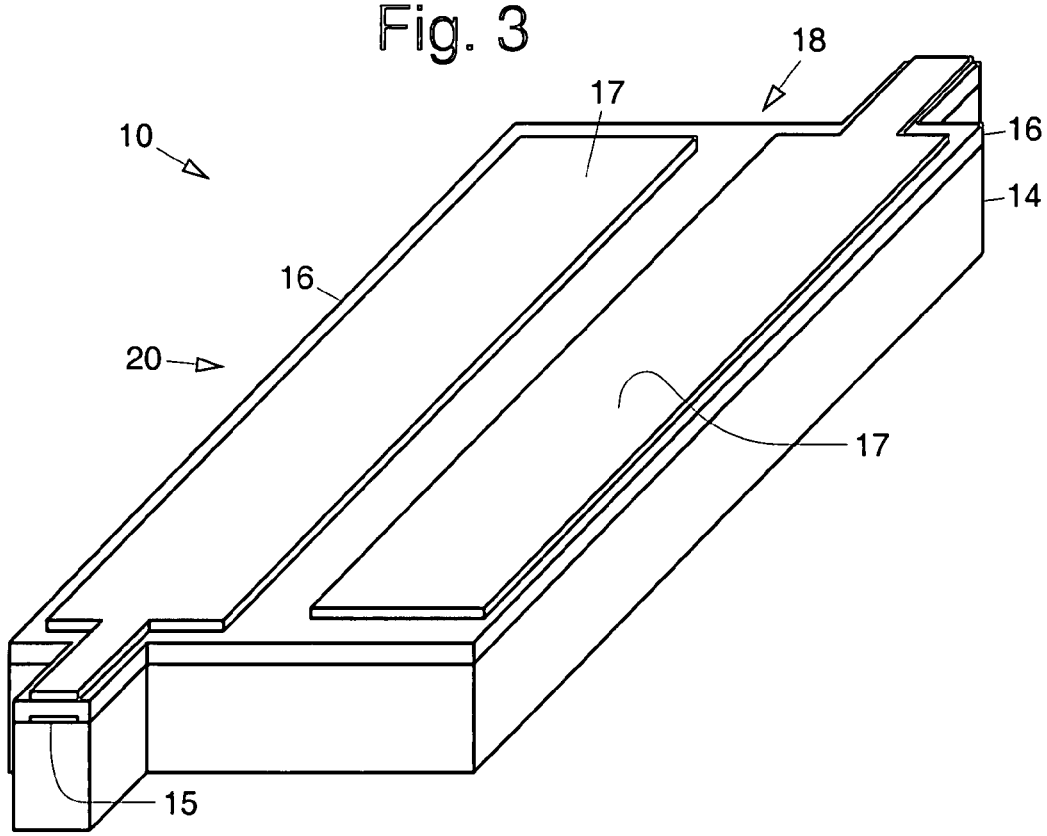
FIG. 3 illustrates a third exemplary monolithic thin-film piezoelectric-on-substrate filter.

FIG. 3 illustrates a third exemplary monolithic thin-film piezoelectric-on-substrate filter 10. Only the resonant structure 20 of the filter 10 is shown in FIG. 3. The resonant structure 20 of the exemplary filter 10 comprises a substrate 14 on which a piezoelectric layer 16 is disposed. A plurality of elongated upper electrodes 17 is disposed on top of the piezoelectric layer 16. The elongated upper electrodes 17 have a gap 18 between adjacent lateral sides thereof. This design and its variations are suitable for exciting dual thickness modes of the structure.

Figure 4A:
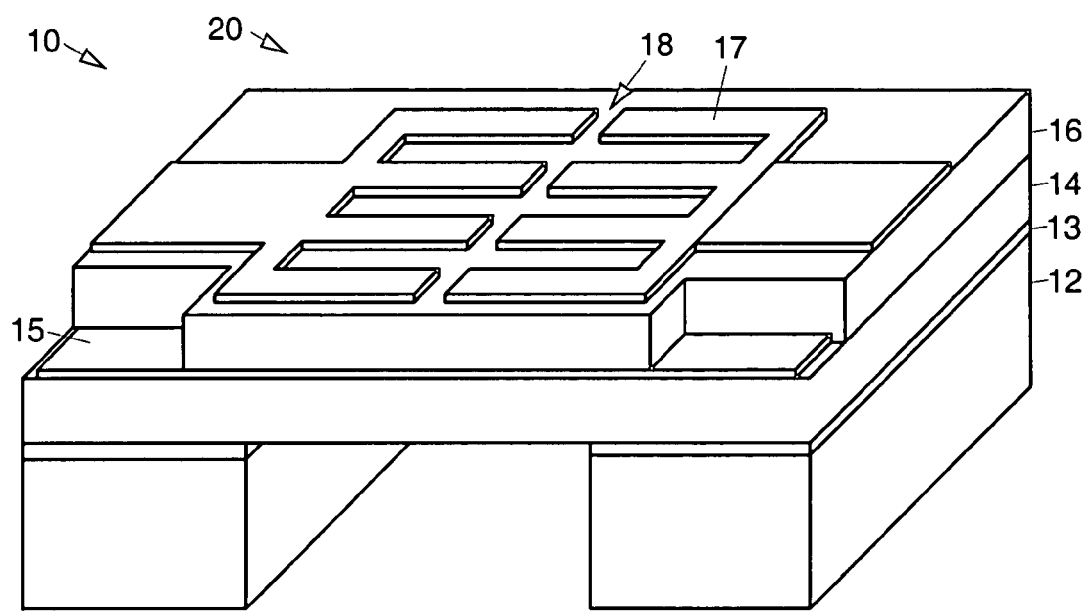
FIGS. 4a-4f illustrate exemplary monolithic thin-film piezoelectric filters with piezoelectric-on-substrate, piezoelectric, and piezoelectric-on-insulator resonant structures.
Figure 4B:
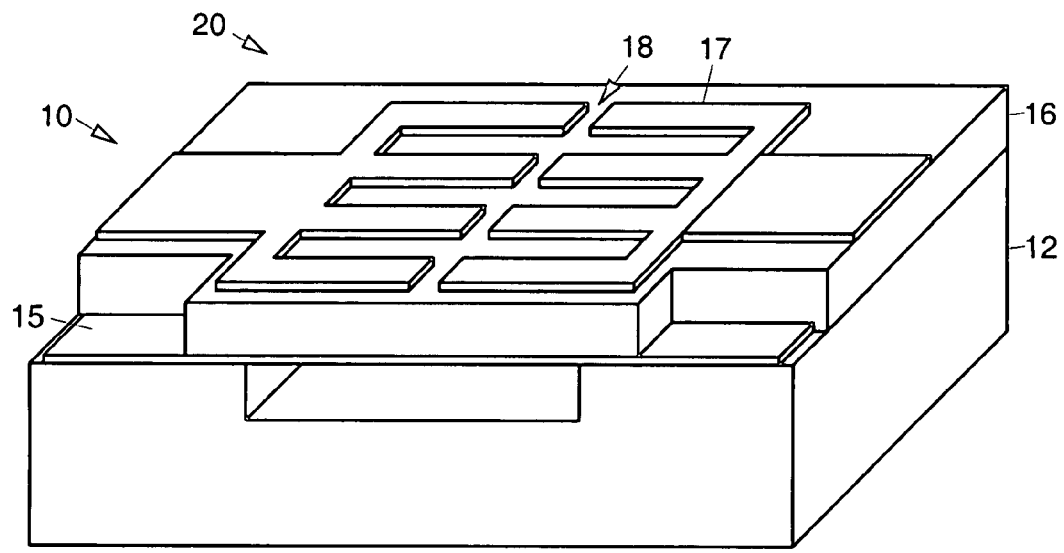
Figure 4C:
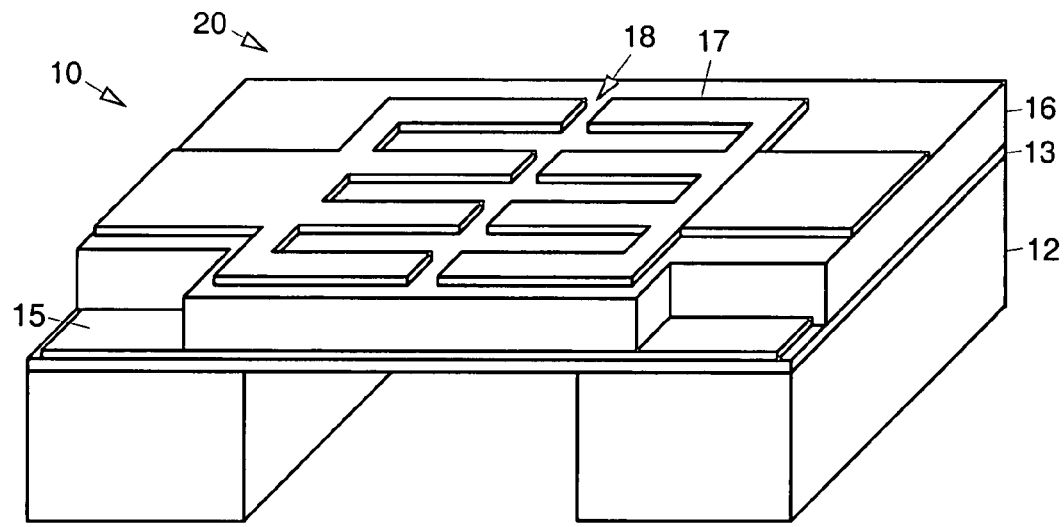
Figure 4D:
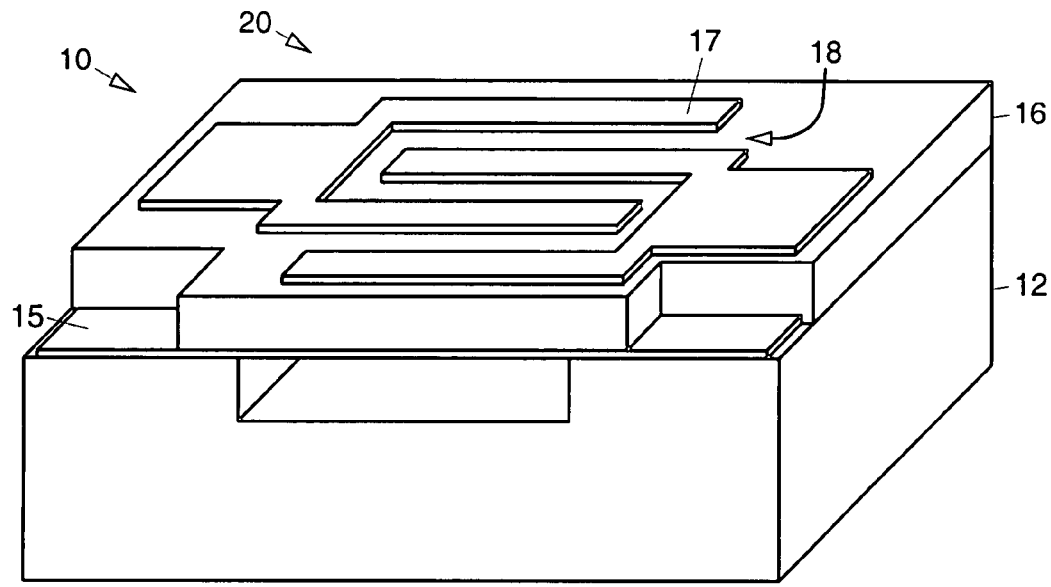
Figure 4E:
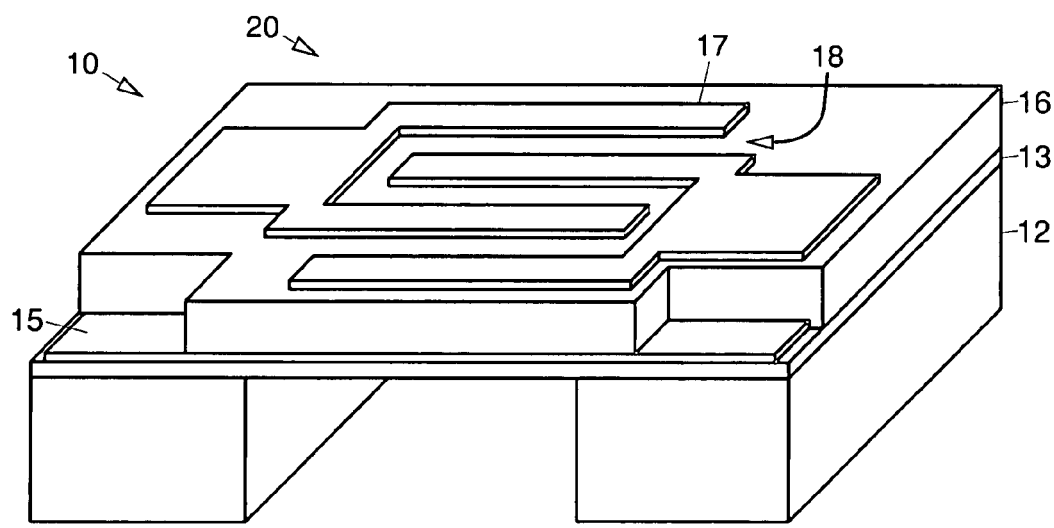
Figure 4F:
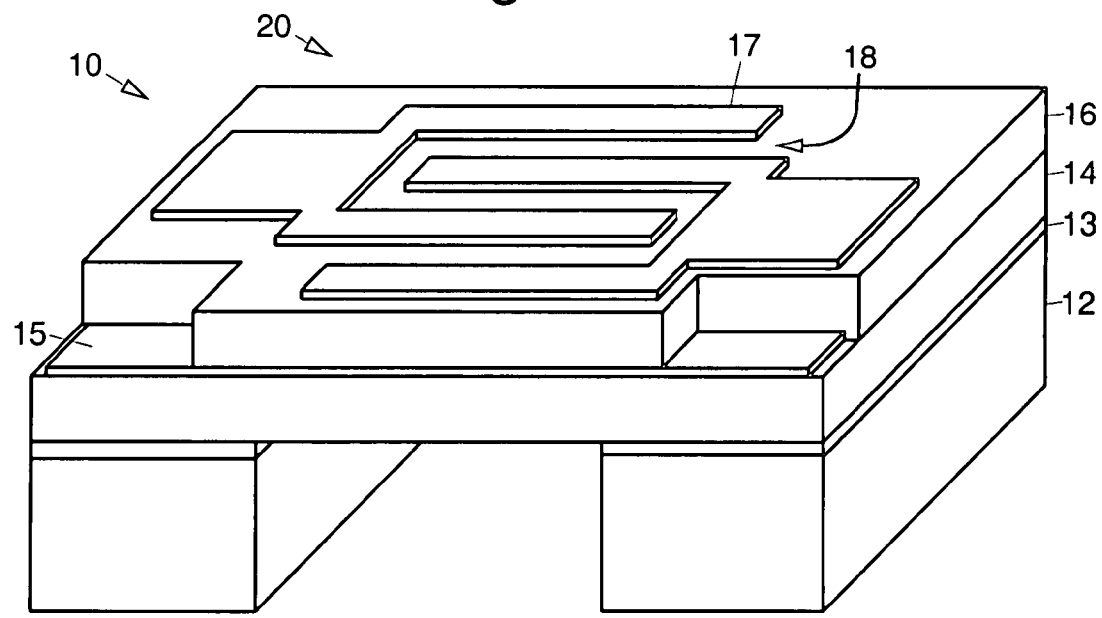

FIGS. 4a-4f illustrates additional exemplary monolithic thin-film piezoelectric filters 10. FIGS. 4a-4c are alternative designs for higher order lateral filters 10 implemented on different substrates 12, 13, 14. The resonant structure 20 in FIG. 4a is substantially the same as is shown in FIG. 2, and comprises a piezoelectric layer 16 disposed on a substrate 12, 13, 14. However, in this design, suspension beams 19 are eliminated and the released resonant structure 20 (or resonant plate) is solidly connected to its surroundings. The resonant structure 20 of the filter 10 shown in FIG. 4b comprises a piezoelectric layer 16 with metallic electrodes 15, 17 suspended over a cavity created on a handle substrate 12. In FIG. 4c, the resonant structure 20 of the lateral filter 10 is suspended over an insulator layer 13 bridging over a hole created in the handle substrate 12 from the backside. In all of these lateral filters, the center to center finger pitch size determines the center frequency of the filter and the thickness and the length of the fingers/resonant structure determined the bandwidth. The thicker the metal is the lower the bandwidth will be. Increasing the length of the structure will reduce the bandwidth as well. FIGS. 4d-4f illustrate a similar variety of resonant structures 20 for thickness mode monolithic filters 10. In these filters thickness of the resonant structure will determine the resonant frequency and the finger pitch size will affect the bandwidth. Larger bandwidth is predicted when the interdigitated fingers are designed with smaller pitch size (larger number of fingers on a specific are).

Operating Principle

The resonant structure 20 is a free-standing plate comprising a stack of top and bottom metal electrode layers 17, 15 (electrodes 17, 15), such as ZnO, and optionally a substrate 14, such as silicon. The bottom and top electrode layers 15, 17 are patterned over the suspended plate and can be connected to interface pads in ground-signal-ground (GSG) configuration. Incorporating two sets of isolated electrodes 17, 15 and separating those enables excitation of coupled dual resonance modes of the plate, for which the resonance frequencies are close.

Like any other coupled resonator system, the frequency spacing between resonance modes (filter bandwidth) is determined by the coupling strength. The coupling strength in monolithic filters is dependent on the thickness and the dimension of the metal electrodes 15, 17 and the geometry and dimensions of the resonant structure.

Dimensions and the geometry of the free-standing resonant structure 20, location of the support beams 19 and the pattern of the metal electrodes 17, 15 are among the design parameters that can be employed to target specific resonance frequency and suppress other resonance modes. Thickness extensional resonance modes will always appear in these devices regardless of the design strategy. However, by carefully shaping the electrodes 17, 15, the electromechanical coupling for these modes can be either minimized (if not desired) or maximized (if they are targeted).

Fabrication Process

An exemplary fabrication process for producing the filters 10 comprises a five-mask low-temperature process. The starting substrate 11 may be a high-resistivity SOI wafer whose silicon device layer 14 has a thickness on the order of 2-6 μm. Using a high-resistivity substrate 11 can reduce the feedthrough signal level and improve the isolation. First, the bottom metal electrode 15 (e.g., gold) is evaporated and patterned using a lift-off process. Next, a high quality thin ZnO film 16 (piezoelectric layer 16) (<1 μm) is sputtered at elevated temperature (200-250° C.). The top metal electrode layer 17 (e.g., Al) is then evaporated and patterned. Access holes are etched chemically into the ZnO layer 16 to reach the bottom electrode 15. Afterwards, the device structure is defined by etching through the ZnO layer 16 and the silicon substrate 11. The ZnO film 16 may be etched chemically in an ammonium chloride solution and the silicon substrate 11 may be dry-etched using a Bosch recipe in an inductively coupled plasma (ICP) tool. Then, the device is flipped over and the silicon substrate 11 and the buried oxide layer 13 under the resonator structure 20 are etched in an ICP tool to release the structure 20. Using this technique, devices with large free-standing platform area can be realized in order to reduce the insertion loss of the fabricated filters 10.

Design

Depending on the frequency of interest, different categories of resonance modes can be employed to realize monolithic thin film piezoelectric-on-substrate filters 10. For low-frequency (LF) and intermediate-frequency (IF) bands flexural resonance modes are suitable. Lateral extensional resonance modes suit IF to low RF applications and thickness extensional modes are of interest for GHz range applications. Simulating the resonance mode-shape of a chosen structure provides considerable insight for optimization of the electrode pattern to maximize the electromechanical coupling and consequently reduce the insertion loss of the filter 10. Surface areas on a composite structure in which the polarity of the strain field is identical at resonance should be covered with connected pieces of metallic electrode 17. Connecting areas with opposite polarity strain field will result in charge cancellation and reduces the coupling coefficient.

Although this design technique is always valid, it loses applicability very quickly when the resonant structure 20 is enlarged in order to reduce motional impedance. Finding the resonance mode shapes of large structures requires very large number of meshing elements in finite element analysis tools which makes the technique impractical. However, some intuitive design rules extracted from simulating simple structures can be loosely applied for more complicated cases. Below, two resonant mode shapes of a simple plate are discussed to better explain some of these rules.

Lateral Mode

Assume a rectangular plate (as shown in FIG. 2) comprising a relatively thick silicon device layer 14 coated with a thin ZnO layer 16. The strain field for the third lateral extensional resonance mode has a three-region periodic pattern along the width of the structure. Moving from each region to the next the polarity of the strain field alternates. Therefore, the appropriate pattern for the electrodes 15, 17 on the structure 20 is shown in FIG. 2.

The two center metal electrodes 17 which are not connected to the rest of the electrode fingers do not contribute to the transduction of energy and are placed to unify loading effects of the metal layer 17 and can be eliminated (as it is the case in FIGS. 4a-4c). By changing the length of the device and the separation between two sets of electrodes 17, 15, the bandwidth of the filter 10 can be systematically altered. Increasing the separation and the length of the electrodes 17, 15 reduce the bandwidth of the filter 10. This is based on simulation results and has been verified practically by measuring frequency response of fabricated devices. In order to reduce the motional impedance of a filter 10 at the same resonance frequency, the same pattern can be repeated along the width of the device (higher order modes) laterally.

Thickness Mode

The same structure discussed above was considered for the first thickness extensional resonance mode, and this structure is illustrated in FIG. 3. This thickness-extensional mode-shape is symmetric relative to the X=0 axis. By looking into other mode-shapes in the close frequency vicinity, a dual mode-shape is identified at a slightly lower frequency. In this mode-shape each half of the structure resonates in the thickness mode and their associated particle displacements are out-of-phase. Therefore, the optimized electrode pattern for excitation and coupling of these two resonance modes can be predicted as shown in FIG. 3. Since the piezoelectric layer 16 comprises a small fraction of the structure cross section, the strain field developed in the film 16 and consequently the electromechanical coupling for the first thickness mode is weak. In order to achieve low insertion loss filters, high-order thickness modes should be targeted for thin-film piezoelectric-on-substrate filters. This is in contrast with thin-film bulk acoustic piezoelectric filters in which the first thickness mode has the lowest insertion loss.

Measurement

Figure 5:
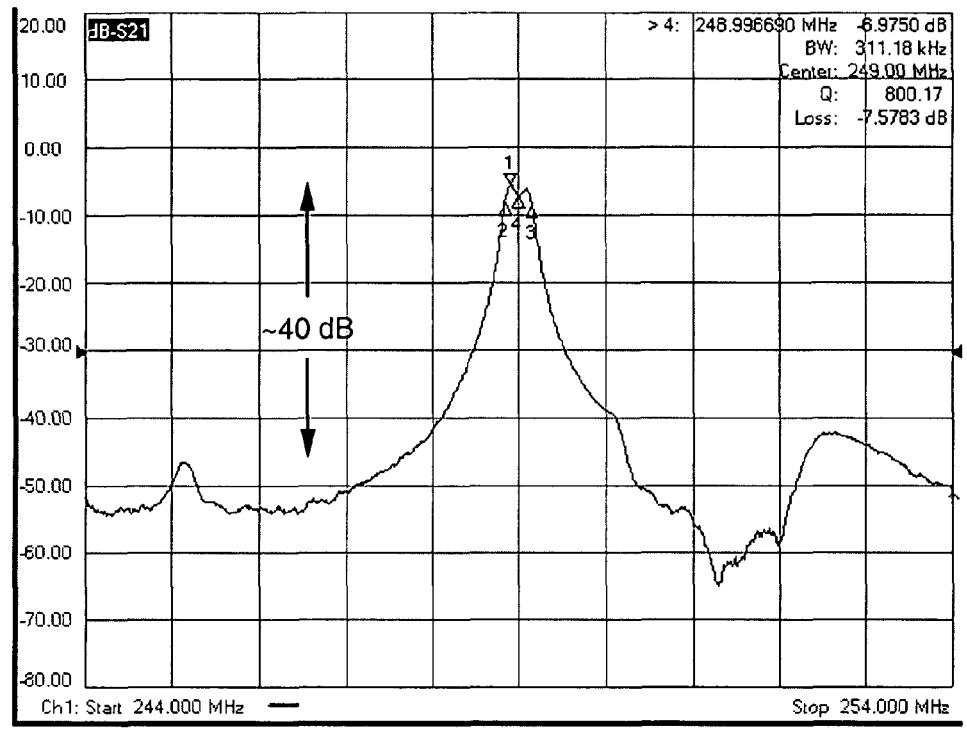
FIG. 5 is a measured frequency response plot of a 250 MHz laterally excited monolithic thin-film piezoelectric-on-substrate filter.

Fabricated monolithic thin film piezoelectric-on-substrate filters 10 on a 5 μm thick SOI substrate were tested on a Suss RF probe station using Agilent E5071B and E8364B network analyzers in atmospheric pressure. SOLT calibration was performed with GSG probes. Two-port s-parameter measurements were taken, and saved as frequency plot pictures and touchstone (.s2p) data files. FIG. 5 is a frequency plot measured from a laterally exited 15 μm wide rectangular plate thin film piezoelectric-on-substrate filter 10 at the center frequency of ~250 MHz. A filter Q of ~800 is measured with <7 dB loss under 500_matched termination condition.

Figure 6:
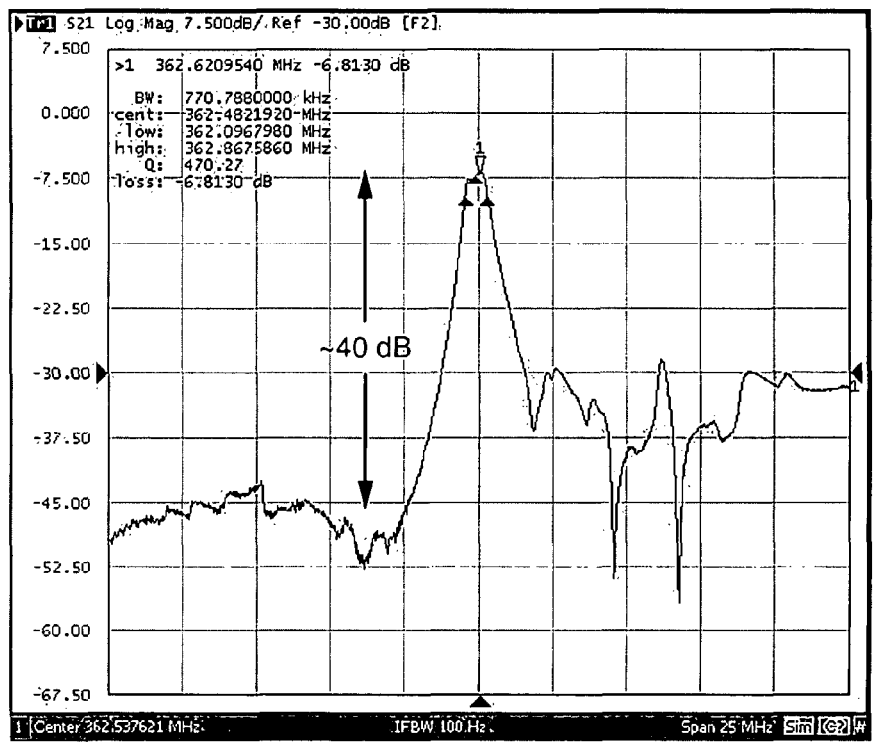
FIG. 6 is a measured frequency response plot of a 360 MHz laterally excited monolithic thin-film piezoelectric-on-substrate filter.

FIG. 6 is a frequency plot measured from a high-order lateral extensional monolithic thin-film piezoelectric-on-substrate filter 10 that employs two sets of spaced finger arrays (10 μm pitch). In order to reduce the insertion loss of the filter, simulated inductive tuning is performed using the network analyzer and ~6 dB improvement is achieved. A filter Q of ~470 is demonstrated for this filter 10.

Figure 7:
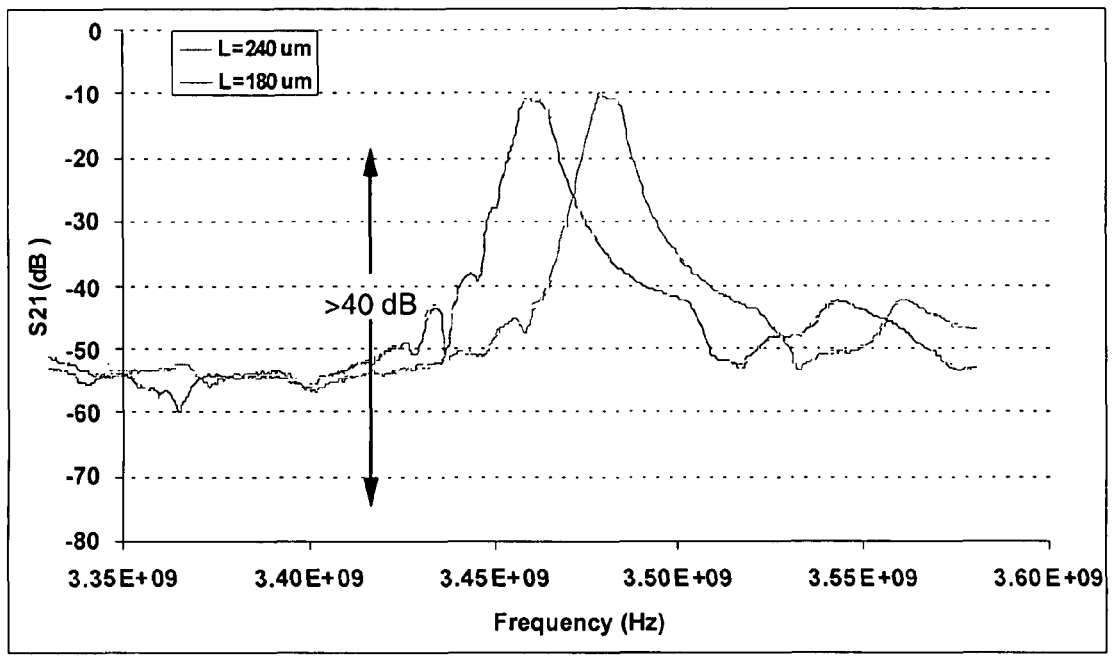
FIG. 7 is a measured frequency response plot of 3.5 GHz thickness mode monolithic thin-film piezoelectric-on-substrate filters.

Results from two different monolithic thin film piezoelectric-on-substrate filters 10 designed for operation in a high-order thickness extensional mode are shown in FIG. 7. The overlapped measured plots are taken from adjacent devices with various length dimension of the filter 10.

The frequency response plots replicate each other with a frequency offset of less than 20 MHz at a center frequency of ~3.45 GHz well suited for applications requiring simultaneous operation at adjacent channels in WiMAX frequency band. See for example, "IEEE recommended practice for local and metropolitan area networks. Coexistence of fixed broadband wireless access systems," *IEEE Std.* 802.16.2-2004 (*Revision of IEEE Std* 802.16.2-2001), 2004. The filter bandwidth is ~8.5 MHz resulting in a filter Q of >400. The simulated inductive tuning is performed and ~9 dB improvement in the insertion is achieved. The measured isolation of >40 dB is remarkably large for a second order filter consuming a small area of less than 500 μm by 250 μm.

Figure 8:
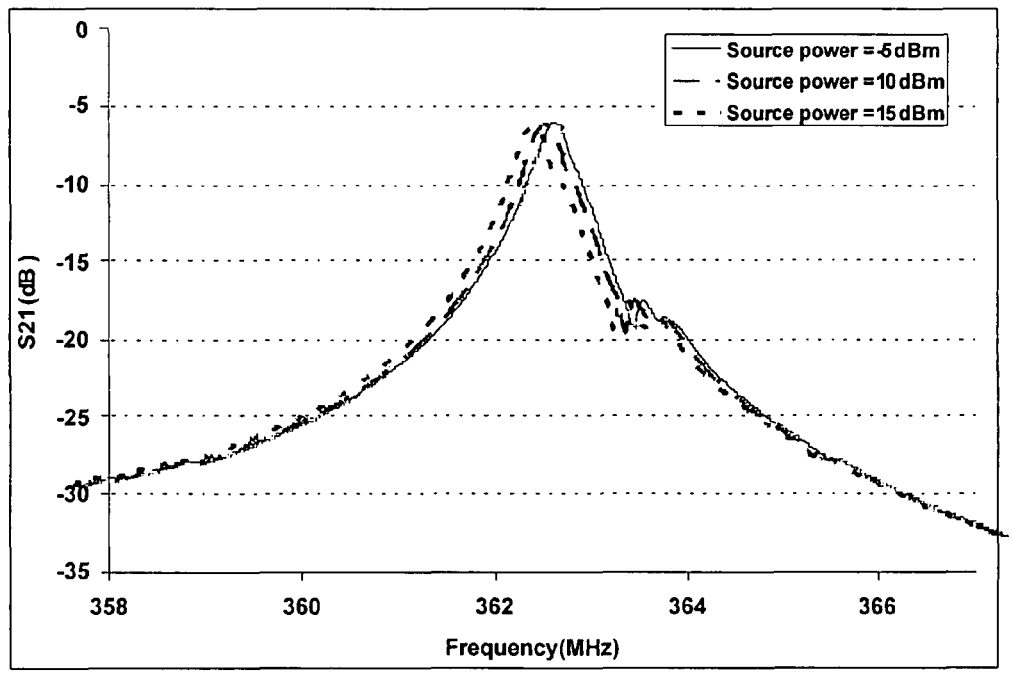
FIG. 8 is a plot that illustrates linearity of a 362 MHZ lateral mode thin-film piezoelectric-on-substrate resonator.

The linearity of the filters 10 can be measured by increasing the source power of the network analyzer to find 1 dB compression point. FIG. 8 shows frequency response plots from a 362 MHz resonator at different source powers. As seen in these plots, the resonance peak moves slightly to the left but the amplitude change is less than 0.2 dB at 15 dBm applied power (the equipment output power limit).

Thus, monolithic thin-film ZnO-on-silicon filters 10 may be designed and fabricated utilizing lateral extensional resonance modes (fundamental or high-order width- or length-extensional modes), thickness extensional resonance modes (fundamental or high-order thickness-extensional modes), or shear modes of a free-standing composite plate structure. Co-fabricating thickness and lateral mode devices (with various thickness and lateral dimensions) on the same substrate enables multiple-frequency bandpass filters on a single chip. By changing the lateral dimension of these filters 10, both coarse and fine frequency offset is achievable in laterally-excited and thickness mode devices. Single-chip multi-band narrow bandwidth filters 10 with large out-of-band rejection have been fabricated using a simple and low-temperature process in a small footprint, suitable for channel-select filtering in new generation wireless communication equipment. Narrow bandwidth lateral mode second order filters 10 for operation at IF and in the low RF range and two filters 10 with a 20 MHz frequency shift in WiMAX frequency band (~3.5 GHz) have been demonstrated.

Thus, monolithic acoustically coupled thin-film piezoelectric filters have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A microelectromechanical acoustic filter apparatus comprising:
    a substrate; and
    a resonant structure released from and supported by the substrate that comprises:
        a thin-film piezoelectric layer disposed between a lower electrode and a plurality of electrically isolated upper electrodes patterned to excite a plurality of acoustically-coupled resonance modes of the resonant structure, wherein the resonant structure is connected by way of support beams to the substrate;
    wherein the order of the frequency response of the filter is greater than two.

2. The apparatus recited in claim 1 wherein the material of the thin-film piezoelectric layer is selected from a group including zinc oxide (ZnO), aluminum nitride (AlN), and lead zirconate titanate (PZT).

3. The apparatus recited in claim 1 wherein the lower electrode and the plurality of upper electrodes excite fundamental or high-order width- or length-extensional, resonance modes of the structure.

4. The apparatus recited in claim 1 wherein the lower electrode and the plurality of upper electrodes excite fundamental or high-order thickness-extensional resonance modes of the structure 5. The apparatus recited in claim 1 wherein the lower electrode and the plurality of upper electrodes excite shear resonance modes of the structure.

6. The apparatus recited in claim 1 wherein the resonant structure further comprises a portion of the substrate.

7. The apparatus recited in claim 1 wherein the substrate comprises an insulating layer disposed on a lower support substrate and wherein the resonant structure further comprises a portion of the insulating layer.

8. The apparatus recited in claim 1 wherein a cavity is formed beneath the resonant structure to release it from the substrate.

9. The apparatus recited in claim 1 wherein the substrate comprises a silicon-on-insulator substrate.

10. Microelectromechanical acoustic filter apparatus comprising:
    a substrate comprising a silicon-on-insulator (SOI) substrate; and
    a resonant structure released from and supported by the substrate that comprises:
        a thin-film piezoelectric layer disposed between a lower electrode and a plurality of electrically isolated upper electrodes that comprise interdigitated fingers to provide a second order filter that operates in fundamental or high-order thickness-extensional mode; and
        a portion of the silicon device layer of the SOI substrate.

11. The apparatus recited in claim 10 wherein a cavity is formed beneath the resonant structure to release it from the substrate.

12. The apparatus recited in claim 10 wherein a pattern and/or the dimensions of the electrically isolated interdigitated fingers are altered to design for the filter bandwidth.

13. The apparatus recited in claim 10 wherein the substrate comprises an insulating layer disposed on a silicon substrate and the resonant structure further comprises a portion of the insulating layer.

14. A microelectromechanical acoustic filter apparatus comprising:
    a substrate; and
    a resonant structure released from and supported by the substrate that comprises:
        a thin-film piezoelectric layer disposed between a lower electrode and a plurality of electrically isolated upper electrodes that comprise two sets of spaced apart opposed electrically connected fingers to provide a second order filter that operates in lateral, fundamental or high-order width- or length-extensional, resonance mode, the plurality of electrically isolated upper electrodes patterned to excite a plurality of acoustically-coupled resonance modes of the resonant structure;

wherein the substrate comprises a silicon-on-insulator (SOI) substrate and wherein the resonant structure further comprises a portion of the silicon device layer of the SOI substrate.

15. The apparatus recited in claim 14 wherein the substrate comprises an insulating layer disposed on a silicon substrate and the resonant structure further comprises a portion of the insulating layer.

16. The apparatus recited in claim 14 wherein the substrate comprises polycrystalline diamond disposed on a silicon substrate.

17. The apparatus recited in claim 14 wherein the pattern and/or dimensions of the spaced apart sets of connected fingers are altered to design for the filter bandwidth.

18. The apparatus recited in claim 14 wherein a cavity is formed beneath the resonant structure to release it from the substrate.

* * * * *

UNITED STATES PATENT AND TRADEMARK OFFICE
CERTIFICATE OF CORRECTION

PATENT NO. : 7,847,656 B2  
APPLICATION NO. : 11/881100  
DATED : December 7, 2010  
INVENTOR(S) : Ayazi et al.

Page 1 of 1

It is certified that error appears in the above-identified patent and that said Letters Patent is hereby corrected as shown below:

Column 1, line 56, change "Proceesings" to --Proceedings--.

Signed and Sealed this  
First Day of February, 2011

David J. Kappos  
*Director of the United States Patent and Trademark Office*